United States Patent [19]

Horn et al.

[11] Patent Number: 5,529,887
[45] Date of Patent: Jun. 25, 1996

[54] WATER SOLUBLE FLUORIDE-CONTAINING SOLUTION FOR REMOVING CURED PHOTORESIST AND SOLDER RESIST MASK

[75] Inventors: Klaus Horn, Hofheim; Jurgen Lingnau, Mainz; Klaus-Peter Martens, Solms, all of Germany

[73] Assignee: Morton International, Inc., Chicago, Ill.

[21] Appl. No.: 219,159

[22] Filed: Mar. 29, 1994

[30] Foreign Application Priority Data

Mar. 31, 1993 [DE] Germany ............................ 9304878 U

[51] Int. Cl.$^6$ .............................. G03C 5/00; C11D 7/08; C03C 23/00; B08B 7/00
[52] U.S. Cl. .......................... 430/331; 430/329; 430/256; 134/2; 134/38; 134/40; 134/42; 252/143; 252/158; 252/170; 252/174.21; 252/DIG. 8
[58] Field of Search ..................................... 430/329, 331, 430/256; 134/2, 38, 40, 42; 252/143, 158, 170, 174.21, DIG. 8

[56] References Cited

U.S. PATENT DOCUMENTS

| | | | |
|---|---|---|---|
| 3,250,644 | 5/1966 | Marcus | 430/329 X |
| 4,165,295 | 8/1979 | Vander Mey | 252/143 |
| 4,215,005 | 7/1980 | Vander Mey | 252/153 |
| 4,592,787 | 6/1986 | Johnson | 134/38 |
| 5,236,552 | 8/1993 | Fang | 430/329 X |
| 5,304,252 | 4/1994 | Condra et al. | 430/329 X |

FOREIGN PATENT DOCUMENTS

| | | |
|---|---|---|
| 0547488 | 6/1993 | European Pat. Off. . |
| 1-310356 | 12/1989 | Japan . |
| 2-135352 | 5/1990 | Japan . |
| 3-113450 | 5/1991 | Japan . |
| 15217 | of 1895 | United Kingdom ................... 430/329 |

OTHER PUBLICATIONS

Julius Grant, Hackh's Chemical Dictionary 4th Ed., p. 274, 1969.
Derwent English Language Abstract Of JP-1310356.
Vol. 14 No. 366 English Language Abstract Of JP-2135352.
Vol. 15 No. 316 English Language Abstract Of JP-3113450.

*Primary Examiner*—George F. Lesmes
*Assistant Examiner*—Bernard P. Codd
*Attorney, Agent, or Firm*—Nick C. Kottis; Gerald K. White

[57] ABSTRACT

A coating-removing solution for photo-cross-linked and thermally cross-linked photoresist masks and solder resist masks cross-linked by exposure to light and heat and which solution contains a diglycol monoalkyl ether, a glycol monoalkyl ether, an alkali hydroxide, water, and a water-soluble fluoride.

19 Claims, No Drawings

WATER SOLUBLE FLUORIDE-CONTAINING SOLUTION FOR REMOVING CURED PHOTORESIST AND SOLDER RESIST MASK

The invention concerns a solution for removing photo-cross-linked photoresist masks.

Photoresist masks are made by exposing an image on the photoresist layer and then rinsing off the unexposed areas with a suitable solvent, or with a suitable developing solution. Negative photoresists are cross-linked or polymerized on the areas which have been exposed to light, thus becoming insoluble, so that the unexposed areas can be rinsed off with the developer. The cross-linked or polymerized areas of the image generally have high resistance to processing chemicals such as etching solutions or electroplating baths. They have the disadvantage, though, that they are harder to remove after etching or electroplating than are positive layers, in which the solubility of the imaged areas is not reduced by cross-linking. It is particularly difficult to remove or peel off layers from boards that have also been cross-linked by heating. Such masks are used primarily as solder resist masks. The light-sensitive photopolymerizable materials used for this application usually contain polymers; binders that are soluble in organic solvents and occasionally in aqueous alkaline solutions; compounds that undergo free-radical polymerization, usually polyunsaturated acrylates or methacrylates, thermally cross-linkable polymers or oligomeric compounds such as epoxy resins; thermally activated curing agents for the cross-linkable compounds; and occasionally dyes or pigments and colorless inorganic pigments such as silicon dioxide, magnesium oxide, barium sulfate or calcium silicate.

When such materials are developed, hard insoluble deposits often form on the walls, pipes, spray nozzles, and heating coils of the processing machines and are very difficult to remove. It is particularly critical if such sediments deposit in the spray tubes and spray nozzles and clog them.

The solutions usually employed to remove coatings of primary-image or solder photoresist or lead resist masks hardened by exposure to light and perhaps by heating, as mentioned above, are relatively concentrated aqueous solutions of alkali hydroxides or quaternary ammonium bases or mixtures of organic solvents with each other or with said basic aqueous or purely organic solutions. If the masks to be removed have been stored for a long period, or have been thermally cross-linked, they can often no longer be removed by using the prior-art coating removal solutions without leaving a residue. On long contact or at elevated temperature, the carrier materials of the circuit boards are attacked. For instance, the glass fiber matrix of glassfiber-reinforced compression-molded plastic boards is exposed, or the individual layers of multilayer circuits separate from each other.

The objective of the invention was to propose a solution that is suitable for removing even hard-to-remove, e.g., thermally cross-linked photoresist masks or solder resist masks, without attacking the circuit boards which they cover and without removing circuitry. The solution was also to be suitable for removing residues in processing machines, especially developing machines.

The invention presents a developer solution for photo-cross-linked and, in some cases, thermally cross-linked photoresist masks, as well as for exposed and thermally cross-linked solder resist masks. The developer solution contains, as essential components, a diglycol monoalkyl ether, a glycol monoalkyl ether, an alkali hydroxide, an alkali fluoride and water.

The diglycol ethers are derived from dialkylene glycols having 2 to 4, preferably 2 or 3, carbon atoms. Diethylene glycol ethers are especially preferred, but dipropylene glycol ethers can also be used advantageously. The alkyl ether group generally has 1 to 4, preferably 1 or 2, carbon atoms. The glycol monoalkyl ethers can be derived from the same glycols as the dialkylene glycol ethers. The alkyl ether groups of the glycol monoalkyl ether can contain from 1 to about 6, preferably 2 to 6, carbon atoms. The preferred alkali hydroxides are sodium or potassium hydroxide, more preferably potassium hydroxide. The alkali hydroxide can also consist partially or entirely of a quaternary ammonium hydroxide. A water-soluble fluoride, especially an alkali fluoride, is an essential component of the coating-removing solution. Here, too, sodium or potassium fluoride is particularly preferred. The solution also contains water. It is generally provided as a concentrate which can be used as such or diluted as needed with water. The proportions of the components of the concentrate are generally within the following ranges:

|  |  | Preferably |  |
|---|---|---|---|
| Diglycol monoalkyl ether | 15–60 | 20–55% | by weight |
| Glycol monoalkyl ether | 10–50 | 10–35% | by weight |
| Fluoride | 1–5 | 1–3% | by weight |
| Alkali hydroxide | 10–30 | 15–25% | by weight |
| Water | 12–20 | 15–20% | by weight |

The solution of the invention is usually diluted before use, preferably to 2 to 4 times its volume. At this dilution, it can be used either to remove coatings from photo-cross-linked photoresist masks, especially solder resist masks, or to clean equipment, such as developing machines, in which photocuring resist materials are processed. The solution can be used undiluted for particularly contaminated machines. It normally works at elevated temperature, preferably in the range of 40°–90° C. In equipment with plastic parts, such as polyethylene, polypropylene, or chlorinated polyvinyl chloride, the treatment temperature should preferably not be higher than 50° C.

The photocuring, and particularly photopolymerizable mixtures that can be removed with the solution of the invention following photochemical and, in some cases, thermal hardening, are essentially all known photopolymerizable photoresist materials, especially those that can be processed by developing with aqueous alkaline solutions. The particularly high effectiveness of the solution, though, is manifest primarily on those mixtures that are post-cured by heat after exposure and development. Such mixtures are used especially to produce solder resist masks, such as are described in European Patent Application EP-A 418 733. Such mixtures generally contain:

a) a compound with at least one terminal ethylenically unsaturated group which can form a cross-linked polymer by free-radical initiated chain addition polymerization, b) a water-insoluble polymeric binder that is soluble in aqueous alkaline solution, c) a finely divided mineral pigment based on silicic acid or silicate, d) a polymerization initiator, or combination of polymerization initiators, which can be activated by radiation, e) a compound which can cross-link with itself, with the binder (b) or with the polymer from compound (a) at elevated temperature, and f) in some cases, a cross-linking initiator for compound (e), which can be activated by heat.

The mixture is processed by placing a solution or dispersion of a mixture having the composition given above on the surface of a printed circuit and drying it, exposing an image on the resulting layer with actinic radiation except at the solder pads, rinsing off the unirradiated regions of the layer with a developer, and heating the resulting mask to an elevated temperature.

Silicates or silicic acids are particularly suitable as mineral pigments. The proportion of pigment is generally 20 to 50%, preferably 25 to 40% by weight.

The polymerizable compounds are generally esters of acrylic acid or methacrylic acid with polyfunctional, preferably primary, alcohols. The alcohols should have at least two hydroxyl groups because the desired cross-linking effect is achieved by polyunsaturated compounds. At least doubly unsaturated compounds are preferred. Esters of trimethylolpropane, trimethylolethane, pentaerythritol and dipentaerythritol are especially preferred. The mixture generally contains 10 to 35% of monomer, preferably 15 to 30%, based on the total content of nonvolatile components.

Polymers with lateral carboxyl groups or carboxylic anhydride groups are particularly suitable as polymeric binders. Copolymers of acrylic and methacrylic acid containing acrylates or methacrylates, styrene, acrylonitrile or methacrylonitrile, acrylamide or methacrylamide, or vinyl heterocyclic compounds as comonomers are especially preferred.

Many substances can be employed as polymerization initiators that can be activated by radiation. Examples include polynuclear quinones such as 2-ethylanthraquinone, acridine derivatives such as 9-phenylacridine or benzacridine, phenazine derivatives such as 9,10-dimethylbenz(a)phenazine, quinoxaline or quinoline derivatives such as 2,3-bis-(4-methoxyphenyl)quinoxaline or 2-styrylquinoline, quinazoline compounds or acylphosphine oxide compounds. Photoinitiators which contain trihalomethyl groups that can be split off by light are preferred, especially compounds from the triazine or triazoline series. One preferred example is 2-(4-methoxystyryl)-4,6-bis-trichloromethyl-s-triazine.

The photoinitiators are generally added in proportions of 0.1 to 15, preferably 0.5 to 10% by weight, based on the nonvolatile components of the mixture.

The mixture of the invention also contains a thermally cross-linkable compound. Bifunctional or multifunctional epoxy compounds are preferred. Examples of particularly suitable compounds include bis-glycidyl ethers of bifunctional alcohols and phenols, such as bisphenol A; of polyethylene glycol ethers and polypropylene glycol ethers of bisphenol A; of 1,4-butanediol, hexan-1,6-hexanediol, polyethylene glycol, polypropylene glycol, or polytetrahydrofuran.

Bis-glycidyl ethers of trifunctional alcohols, such as glycerol, can also be used. The epoxides are usually added to the mixture in a proportion of about 10 to 30, preferably 12 to 25% by weight, based on the nonvolatile components of the mixture.

Compounds having condensable N-hydroxymethyl or N-alkoxymethyl groups are also suitable thermally cross-linkable compounds. Hexamethoxymethylmelamine and hexahydroxymethylmelamine are examples.

If epoxy compounds are used as cross-linking agents, the mixture preferably contains a hardener or addition initiator for epoxy groups. The hardener is preferably a nitrogen base such as triethylamine, 1,4-diazabicyclo[2.2.2]octane (Dabco), dibutylamine or more highly alkylated mono-, di-, and tri- aliphatic amines. The proportion of the base is generally between 0.15 and 1.5, preferably between 0.2 and 1.0% by weight.

Aqueous alkaline solutions, e.g., of alkali phosphates, carbonates, or silicates, are preferably suitable developers. In some cases, small proportions, e.g., up to 10% of water-miscible organic solvents or cross-linkers can be added.

Finished developed solder masks are subjected to a thermal treatment before the soldering process. In this treatment, the carboxyl groups, for example, of the binder react with the multifunctional epoxide to produce an interpenetrating network. The mineral solid must also be integrated into this network.

On the whole, it is the thermal post-treatment that produces the good mechanical, thermal and chemical properties of the solder resist masks. This thermal treatment is generally accomplished between 80° C. and 180° C., for treatment periods of about 10 to 90 minutes. The ready-to-solder boards are then hot-air leveled, and electronic components can be plugged into them in the known manner.

Then the conductor side of the plate is usually treated with an appropriate commercial flux and, for example, subjected to wave-soldering in a commercial wave-soldering machine. The solders are the well-known eutectic mixtures that are used at soldering temperatures of about 230° to 250° C.

The exposed and developed coatings can be hardened thermally. The hardened masks are resistant to atmospheric, thermal and chemical effects for an extended period.

The following example explains the invention. If not otherwise stated, percentages and proportions are in parts by weight. Pans by weight and parts by volume are in the ratio of g to ml.

EXAMPLE

The following ingredients were dissolved in 123.9 parts by weight of 3-methoxy-1-butanol in a high-speed stirrer:

112.5 parts by weight of pentaerythritol triacrylate 128.9 parts by weight of trimethyioipropane triacrylate 27.5 parts by weight of 9-phenylacridine 12.4 parts by weight of Neozapon Green 1.2 parts by weight of a blue azo dye 2.5 parts by weight of triethylenediamine.

Then 396.7 parts by weight of a siliceous pigment, a natural agglomerate of corpuscular quartz and laminar kaolinite, was dispersed into the stirred solution over a period of 30 minutes. This suspension was then mixed with 694.2 parts by weight of a 53% solution of a terpolymer of styrene, methacrylic acid, and n-hexyl methacrylate (32:15:3), and the mixture was thoroughly homogenized.

The viscous coating material was milled in a glass ball mill, then filtered through a 160 μm V2A cloth pressure filter and filled into containers.

252 parts by weight of an epoxidated phenol-formaldehyde resin with an epoxy equivalent weight of 172 to 179 was dissolved in 148 parts by weight of 3-methoxybutanol with an anchor blade mixer. After stirring for 15 minutes, the solution was clear, with a 63% solids content.

100 parts by weight of the first solution was intensively mixed with 22.3 parts by weight of the epoxy resin solution. The solids content of the mixture was 67.5%.

A 24×36 cm board of glass cloth –epoxy resin with circuitry of copper traces 0.2 to 1.5 mm wide and 50 to 90 μm thick on both sides, with plated through-holes, was completely coated with the solution described above using a semiautomatic screen-printing machine. The circuit board coated in this manner was left for 5 minutes at room temperature and was then dried for 7 minutes in a mechanical-circulation drying oven at 80° C. After cooling to room temperature, an image was exposed onto the coated circuit board through film photomask.

The development was done within 90 seconds in a pass-through sprayer with 1% aqueous sodium carbonate solution at 30° C. with a spray pressure of 1.2 bar.

After rinsing with water, the developed plate was dried in a continuous hot air drier and then cured for 1 hour in a mechanical-circulation hot air drying oven. The board, now completely cured, was wave-soldered. In this process the board was first taken over a foam fluxer (Alphagrillo® TL 33), predried, and then passed over the liquid solder, which consisted of a eutectic lead/tin alloy. The speed was 0.9 meters/minute, and the solder temperature was 260° C. The circuit board, covered with a solder resist mask at the nonsoldered locations, was treated with a solution to remove the solder resist mask. The solution was a concentrate consisting of:

17.4 parts by weight of water 15.0 parts by weight of KOH 50.0 parts by weight of diethylene glycol monoethyl ether 15.0 parts by weight of ethylene glycol monobutyl ether and 2.6 parts by weight of KF which had been diluted to three times its volume with water. The treatment was done at 70° C. and was finished after 15 minutes. An inspection of the board surface showed that the mask had been removed without leaving any residue. The surface of the circuit board material had not been attacked anywhere. The circuitry could again be coated with a solder resist mask after thorough rinsing with water and drying.

In another experiment, 30 liters of the solution described above was diluted to twice its volume with water. The diluted solution was put into a spray-developing machine which had been used for a long time to develop solder resist masks of the type described above, and which had been badly contaminated by residues on the walls, in the piping, and in the nozzles. The diluted solution was circulated for about 60 minutes at 50° C. After that time, all the deposits had dissolved and the machine could be put back into service again after rinsing with water.

We claim:

1. A coating-removing solution for a mask selected from the group consisting of photo-cross-linked photoresist masks, thermally cross-linked photoresist masks and solder resist masks cross-linked by exposure to light and heating, said solution comprising a basic mixture of a diglycol monoalkyl ether, a glycol monoalkyl ether, an alkali hydroxide, water, and 1–5 percent by weight of a water-soluble fluoride.

2. The coating-removing solution of claim 1, wherein the water-soluble fluoride is an alkali fluoride.

3. The coating-removing solution of claim 2 wherein the coating-removing solution contains 1–5% by weight fluoride.

4. The coating-removing solution of claim 1, wherein the digylcol monoalkyl ether contains an alkyl ether group having 1 to 4 carbon atoms.

5. The coating-removing solution of claim 1, wherein the glycol monoalkyl ether contains an alkyl ether group having 1 to 6 carbon atoms.

6. The coating-removing solution of claim 1, wherein the alkali hydroxide is sodium or potassium hydroxide.

7. The coating-removing solution of claim 1, wherein the coating-removing solution contains 15–60% by weight digylcol monoalkyl ether, 10–50% by weight glycol monoalkyl ether, 15–30% by weight alkali hydroxide and 12–20% by weight water.

8. The coating-removing solution of claim 1, wherein the mask is a photo-cross-linked photoresist mask.

9. The coating-removing solution of claim 1, wherein the mask is a thermally cross-linked photoresist mask.

10. The coating-removing solution of claim 1, wherein the mask is a solder resist mask cross-linked by exposure to light and heating.

11. The coating-removing solution of claim 1 wherein the mask is an epoxy resin.

12. The coating-removing solution of claim 10 wherein the solder resist mask is an epoxy resin.

13. A method of stripping a photo-cross-linked photoresist mask from a surface, said method comprising the step of:

treating the photo-cross-linked photoresist mask with the solution of claim 1.

14. A method of stripping a thermally cross-linked photoresist mask from a surface, said method comprising the step of:

treating the thermally cross-linked photoresist mask with the solution of claim 1.

15. A method of stripping a solder resist mask cross-linked by exposure to light and heating from a surface, said method comprising the step of:

treating the solder resist mask cross-linked by exposure to light and heating with the solution of claim 1.

16. The method of claim 15 wherein the solder resist mask is an epoxy resin and said solution contains 1–5% by weight alkali fluoride.

17. A coating-removing solution for a solder resist mask cross-linked by exposure to light and heating, said solution comprising a basic mixture of a diglycol monoalkyl ether, a glycol monoalkyl ether, an alkali hydroxide, water, and 1–5 percent by weight of a water-soluble alkali fluoride.

18. The coating-removing solution of claim 17 wherein the solder resist mask is an epoxy resin.

19. A mask removal solution, said solution comprising a basic mixture of a diglycol monoalkyl ether, a glycol monoalkyl ether, an alkali hydroxide, water, and a water-soluble fluoride, said solution including said water-soluble fluoride in amount ranging from 1–5 percent, effective for the solution removal of a mask selected from the group consisting of photo-cross-linked photoresist masks, thermally cross-linked photoresist masks and solder resist masks cross-linked by exposure to light and heating.

* * * * *

UNITED STATES PATENT AND TRADEMARK OFFICE
CERTIFICATE OF CORRECTION

PATENT NO. :  5,529,887
DATED      :  25 June 1996
INVENTOR(S) : Klaus Horn et al.

It is certified that error appears in the above-indentified patent and that said Letters Patent is hereby corrected as shown below:

```
At title page, the last word of the title, "MASK"
                                should be --MASKS--.
At column 1, last word of the title,"MASK" should be --MASKS--.
At column 3, line 57, "N-hydroxymethyi" should be
                --N-hydroxymethyl--.

At column 4, line 29, "Pans by weight" should be
                --Parts by weight--.
```

Signed and Sealed this

Fourteenth Day of January, 1997

*Attest:*

BRUCE LEHMAN

*Attesting Officer*          *Commissioner of Patents and Trademarks*